US006232195B1

(12) United States Patent
Yang

(10) Patent No.: US 6,232,195 B1
(45) Date of Patent: May 15, 2001

(54) STRUCTURE OF SEMICONDUCTOR DEVICE

(75) Inventor: Hae Chang Yang, Chungcheongbuk-do (KR)

(73) Assignee: LG Semicon Co., Ltd., Chungcheongbuk-do (KR)

( * ) Notice: Subject to any disclaimer, the term of this patent is extended or adjusted under 35 U.S.C. 154(b) by 0 days.

(21) Appl. No.: 09/133,561

(22) Filed: Aug. 13, 1998

Related U.S. Application Data

(63) Continuation of application No. 08/771,983, filed on Dec. 23, 1996, now Pat. No. 5,841,199.

(30) Foreign Application Priority Data

Dec. 26, 1995 (KR) .................................................. 95-56317

(51) Int. Cl.$^7$ .................................................. H01L 21/20
(52) U.S. Cl. .......................................... 438/384; 438/241
(58) Field of Search .................................... 438/238, 257, 438/283, 275, 240, 384, 241, 242; 257/903, 905, 385

(56) References Cited

U.S. PATENT DOCUMENTS

| | | | |
|---|---|---|---|
| 5,281,843 | 1/1994 | Ochii et al. ........................... | 257/904 |
| 5,395,784 | * 3/1995 | Lu et al. ................................ | 437/52 |
| 5,486,717 | * 1/1996 | Kokubo et al. ....................... | 257/385 |
| 5,491,654 | 2/1996 | Azuma ................................. | 257/903 |
| 5,506,802 | * 4/1996 | Kiyono ................................. | 365/156 |
| 5,578,854 | 11/1996 | Chen et al. ........................... | 257/904 |

FOREIGN PATENT DOCUMENTS 59-130459    7/1984    (JP) .................................... 257/904

OTHER PUBLICATIONS

High Reliability and High Performance 0.35 μm Gate–Inverted TFT's for 16Mbit SRAM Applications Using Self–Aligned LDD Structures, C. T. Liu, IEDM 823–826 (Dec. 13–16, 1992), Electron Devices of Society of IEEE.

* cited by examiner

Primary Examiner—Matthew Smith
Assistant Examiner—Calvin Lee
(74) Attorney, Agent, or Firm—Finnegan, Henderson, Farabow, Garrett, & Dunner, L.L.P.

(57) ABSTRACT

An SRAM semiconductor device is disclosed in which an access transistor is an nMOS TFT to thereby reduce cell size and to improve low Vcc characteristics. The semiconductor device comprises a gate electrode of a drive transistor formed on the semiconductor substrate, with a first gate insulating film therebetween. A first impurity region is formed on the substrate on opposite sides of the gate electrode of the drive transistor. An insulating film is formed on the entire surface of the substrate and has a contact hole exposing part of the gate electrode of the drive transistor. A semiconductor layer is formed on the insulating film in connection with the gate electrode of the drive transistor through the contact hole; a second gate insulating film is formed on the semiconductor layer; and a gate electrode of an access transistor is formed on the second gate insulating film. Further, a second impurity region is formed in the semiconductor layer on opposite sides of the access transistor gate electrode.

3 Claims, 7 Drawing Sheets

STRUCTURE OF SEMICONDUCTOR DEVICE

This is a continuation of application Ser. No. 08/771,983, filed Dec. 23, 1996 now U.S. Pat. No. 5,841,199, the contents of which are incorporated herein by reference.

BACKGROUND OF THE INVENTION

The present invention relates to a semiconductor device structure, and more particularly, to the structure of a semiconductor device in which an nMOS thin film transistor is utilized as an access transistor in a static random access memory (SRAM), thereby reducing cell size and improving low Vcc characteristics.

Generally, in an SRAM, a refresh operation is unnecessary and operation timing of the memory can be easily performed. Thus, the SRAM can be made to have the same access time and cycle time as a microcomputer. Further, the SRAM can be made to operate at high speed comparable to that of a bipolar RAM.

However, as cell capacitance increases, it becomes difficult to decrease power consumption while maintaining the high speed operation in an nMOS SRAM.

Accordingly, a manufacturing process for fabricating the SRAM becomes complex because several different gate threshold voltages are required. Further, an operation margin must be reduced while manufacturing costs continue to increase.

Hereinafter, the structure of a conventional semiconductor device will be described with the reference to the attached drawings.

FIG. 1 is a schematic of a conventional SRAM cell, and FIG. 2 is a cross-sectional view showing a portion of a semiconductor device illustrated in FIG. 1.

In general, a MOS SRAM cell incorporates a flip-flop having a high-resistance load, as shown in FIG. 1. The flip flop includes two cross-coupled invertors respectively consisting of transistors $TR_1$ and $TR_2$ and associated load elements of $R_1$ and $R_2$. Further, nMOS transistors $TR_3$ and $TR_4$ are connected to a data line, and their gates are connected to a word line.

If the word line is at a high level, transistors $TR_3$ and $TR_4$ are turned on, thereby electrically connecting the basic cell to a data line B/L. If $TR_1$ is off and $TR_2$ is on, a data line B/L is set to a low level because current flows in the memory cell through $TR_4$. Data line B/L, however, is charged up through $TR_3$, without a current path to ground. Thus, this becomes a high level.

Conventionally, transistors $TR_1$, $TR_2$, $TR_3$, and $TR_4$ are utilized as bulk transistors.

A semiconductor device structure used in the above-described circuit will now be described.

As shown in FIG. 2, a field oxide film 2 is formed on a predetermined region of a semiconductor substrate 1. An access transistor gate electrode 3 and a drive transistor gate electrode 4 are spaced by a uniform distance on a semiconductor substrate 1. On the entire surface of the resultant structure, an insulating film 5 is formed having a contact hole exposing a portion of gate electrode 4, serving as the gate of a driver transistor. A load resistor layer 6 is formed electrically connected to drive transistor gate electrode 4. A poly-s layer 7 for use as a Vss line is provided between load layer 6 and drive transistor gate electrode 4, but insulated from each other. A metal line 9 is connected to a source impurity region 8 on one side of access transistor gate electrode 3. Access transistor gate electrode 3 corresponds to the gate electrode of $TR_3$ in FIG. 1, and drive transistor gate electrode 4 corresponds to the gate electrode of $TR_2$ in FIG. 1. Further, load resistor layer 6 formed in contact with drive transistor gate electrode 4 corresponds to load resistor $R_1$ In FIG. 1.

A method of manufacturing the conventional semiconductor device having the aforementioned structure is as follows.

To begin with, as shown in FIG. 3a, a first polysilicon layer, doped using $POLI_3$, is deposited on the entire surface of a semiconductor substrate 11 on which a field oxide film was previously formed.

Then, after coating a photoresist film (not shown) on the first polysilicon layer, an access transistor gate electrode region and driver transistor gate electrode region are defined. Using photolithography and etching processes, an unnecessary portion of the first polysilicon layer is selectively removed, thereby forming access transistor gate electrode 12 and drive transistor gate electrode 13.

Using access transistor gate electrode 12 as a mask, a low concentration n-type impurity ion is implanted to form LDD regions. Then, using a gate sidewall as a mask, a high-concentration n-type impurity ion is implanted to thereby form source/drain impurity regions 14 and 14a.

At this time, as shown in FIG. 2, portion A, i.e., source/drain impurity region 8a at the boundary of field oxide film 2 beneath drive transistor gate electrode 4 and an active region are formed due to the diffusion of phosphorous from the $POLI_3$ doping.

As shown in FIG. 3b, a first oxide film 15 and a second polysilicon layer are successively formed on the entire surface of semiconductor substrate 11 including access transistor gate electrode 12 and drive transistor gate electrode 13. After coating a photoresist film (not shown) on the second polysilicon, a Vss line is defined. After patterning using photolithography and etching processes, the second polysilicon is selectively removed, thereby forming a Vss line 16.

As shown in FIG. 3c, a second oxide film 17 is deposited on the entire surface of first oxide film 15 including Vss line 16. Second and first oxide films 17 and 15, respectively, are selectively removed to create a contact hole exposing part of drive transistor gate electrode 13.

A third polysilicon is deposited in contact with driver transistor gate electrode 13. The third polysilicon is then patterned to form a load resistor layer 18.

As shown in FIG. 3d, planarizing oxide film 19 is deposited on the entire surface of second oxide film 15 including load resistor layer 18.

After forming a contact hole so as to expose source impurity region 14 of the access transistor, a metal layer 20 is deposited, thereby completing the manufacturing process of the conventional semiconductor device.

However, in such structure of the conventional semiconductor device, the access transistor and drive transistor are realized as bulk transistors. Thus, the resulting cell size is increased. Further, speed is decreased due to the junction capacitance at the interface of the substrate and the n-type impurity regions. Further, the device suffers from poor low Vcc characteristics due to the bulk effect.

SUMMARY OF THE INVENTION

In order to solve the aforementioned problems, it is an object of the present invention to provide a structure of a semiconductor device in which the access transistor includes an nMOS thin-film transistor, thereby decreasing cell size and junction capacitance and improving low Vcc characteristics.

To accomplish the above object, in an SRAM including a drive transistor, an access transistor and a load resistor, there is provided a semiconductor device structure comprising a semiconductor substrate; a drive transistor gate electrode formed on the semiconductor substrate, with a first gate insulating film interposed therebetween; a first impurity region formed on the substrate on opposite sides of the drive transistor gate electrode; an insulating film formed on the surface of the substrate having a contact hole overlying the gate electrode of the drive transistor, a semiconductor layer connected to the gate electrode of the drive transistor through the contact hole and formed on the insulating film; a second gate electrode of the access transistor formed on the second gate insulating film; and a second impurity region formed on the semiconductor layer on opposite sides of the gate electrode of access transistor $T_3$.

BRIEF DESCRIPTION OF THE ATTACHED DRAWINGS

DETAILED DESCRIPTION OF THE INVENTION

Figure 1:
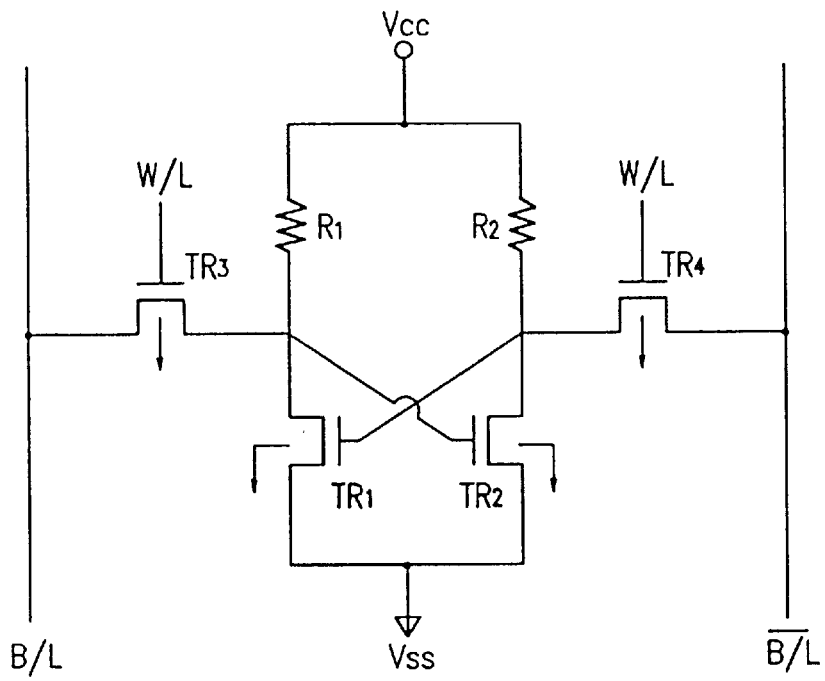
FIG. 1 is a schematic diagram of a conventional semiconductor SRAM cell.
Figure 2:
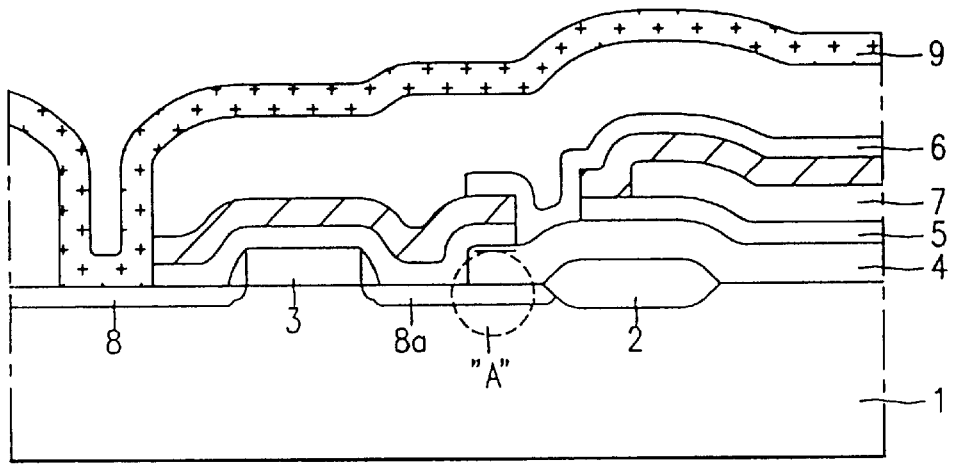
FIG. 2 is a cross-sectional view showing the device structure of a portion of the SRAM cell shown in FIG. 1.
Figure 3A:
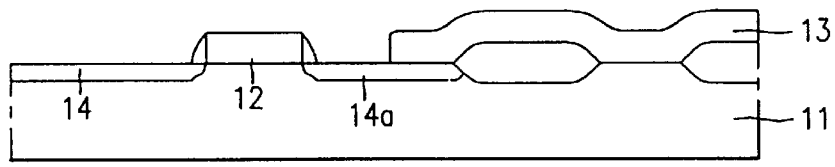
FIGS. 3a to 3d are cross-sectional views illustrating a method for manufacturing the device structure shown in FIG. 2.
Figure 3B:
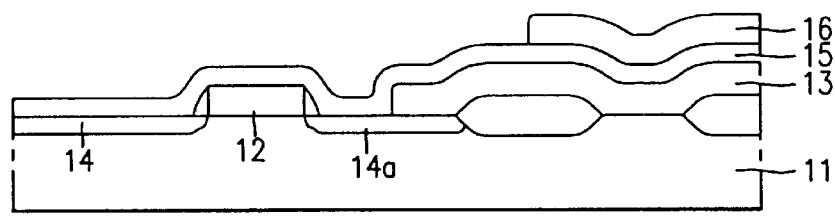
Figure 3C:
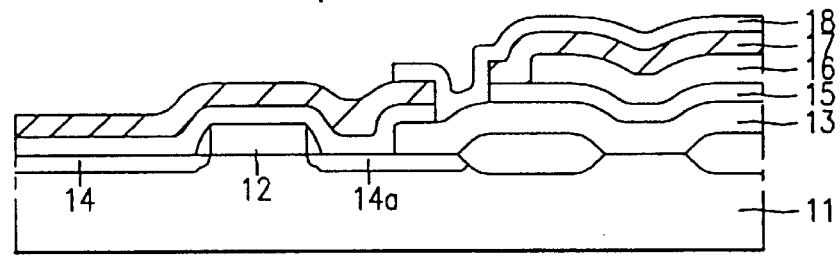
Figure 3D:
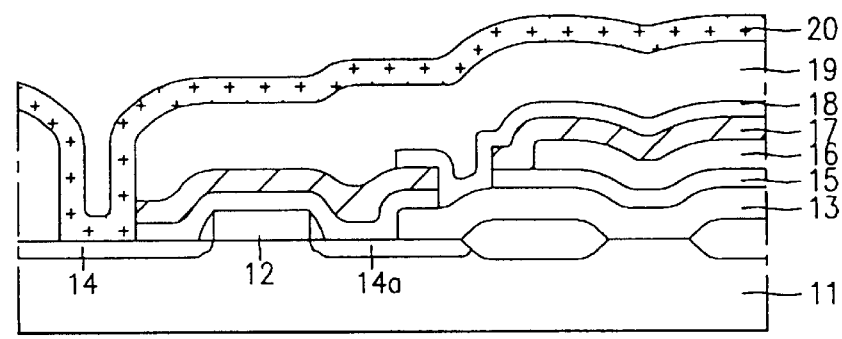
Figure 4:
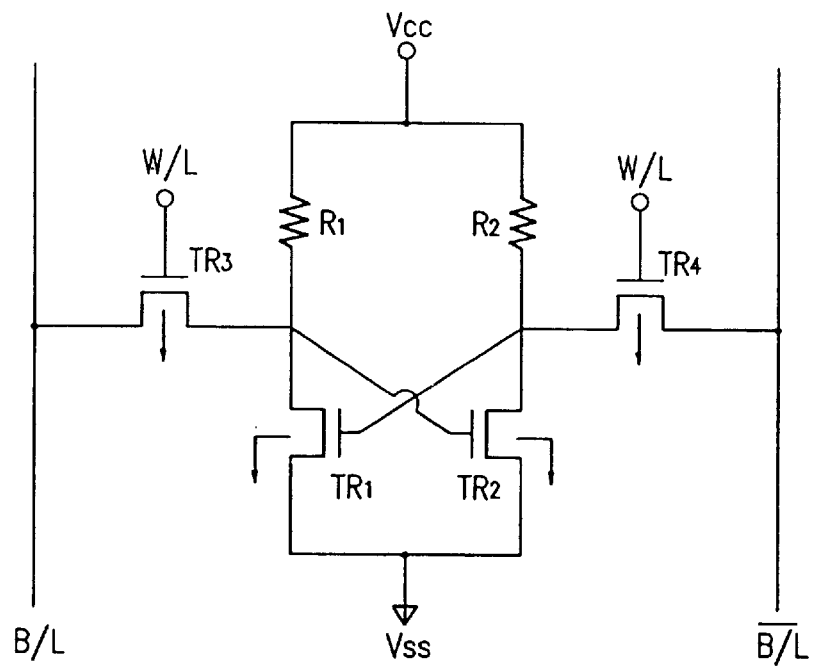
FIG. 4 is a schematic diagram of a semiconductor device according to a first embodiment of the present invention.

As shown in FIG. 4, in the circuit construction of the semiconductor device according to the first embodiment of the present invention, the access transistor is an nMOS TFT, and a load resistor is used as a load element Otherwise, the schematic of the SRAM cell is similar to the schematic shown in FIG. 1.

As further shown in FIG. 4, the basic cell is composed of a flip flop including cross-coupled invertors comprising transistors $TR_1$ and $TR_2$ and associated load elements $R_1$ and $R_2$. NMOS TFTs $TR_1$ and $TR_4$ are connected to a data line B/L and gate terminals of the $TR_3$ and $TR_4$ are connected to a word line W/L. Access transistors $TR_1$ and $TR_4$ are made of nMOS TFTs and the drive transistor $TR_1$ and $TR_2$ are made of bulk transistors.

Figure 5:
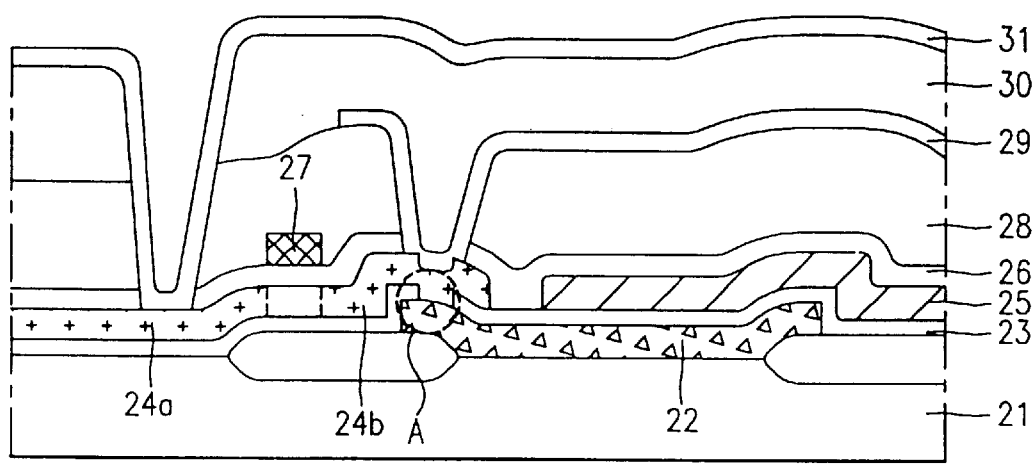
FIG. 5 is a cross-sectional view showing a semiconductor device structure in accordance with a first embodiment of the present invention.

FIG. 5 illustrates in greater detail a semiconductor device structure in accordance with the present invention to be incorporated into the circuit shown in FIG. 4. The semiconductor device structure comprises a field oxide film formed on substrate 21, and a drive transistor gate electrode 22 formed on substrate 21 and a portion of the field oxide film.

A first insulating film 23, having a contact hole exposing part of drive transistor gate electrode 22, is formed over the entire substrate surface. First and second impurity regions 24a and 24b of the access transistor are formed on first insulating film 23. A Vss line 25 is formed on first insulating film 22, spaced from second impurity region 24b, and a second insulating film 26, formed on the entire surface, is provided with a contact hole over second impurity region 24b, which is in contact with drive transistor gate electrode 22. Access transistor gate electrode 27 is formed on second insulating film 26 over an isolation region between first impurity region 24a and second impurity region 24b. A load resistor layer 29 is formed on insulating layer 28 and in electrical contact with second impurity region 24b through a contact hole. A metal layer 31 is formed on insulating layer 30 and in electrical contact with first impurity region 24a through aligned contact holes in insulating layers 28 and 30.

Here, drive transistor gate electrode 22 and access transistor gate electrode 27 in FIG. 5 correspond to gate electrodes of $TR_2$ and $TR_3$, respectively, in FIG. 4.

Further, as shown in FIG. 5, the contact point of second impurity region 24b of the access transistor is formed so as to have the contact hole over the drive transistor gate electrode which corresponds to point A in FIG. 4.

A method of manufacturing the semiconductor device constructed in accordance with the first embodiment of the present invention is as follows.

Figure 6A:
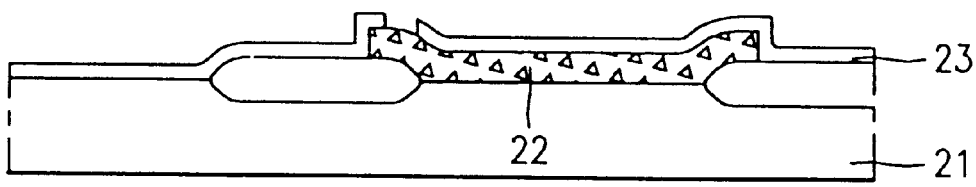
FIGS. 6a to 6f illustrate various process steps for manufacturing the device structure shown in FIG. 5.

As shown in FIG. 6a, a first polysilicon layer is deposited on a semiconductor substrate 21 on which a field oxide film was previously formed. Through photolithography and etching processes, portions of the first polysilicon layer are then selectively removed, thereby forming a gate electrode 22 for a drive transistor.

After coating a first insulating film 23 on the entire surface of the resultant structure, a photoresist film is coated on the substrate and patterned so that a contact hole is formed through to drive transistor gate electrode 22. Then, portions of first insulating film 23 are selectively removed.

Figure 6B:
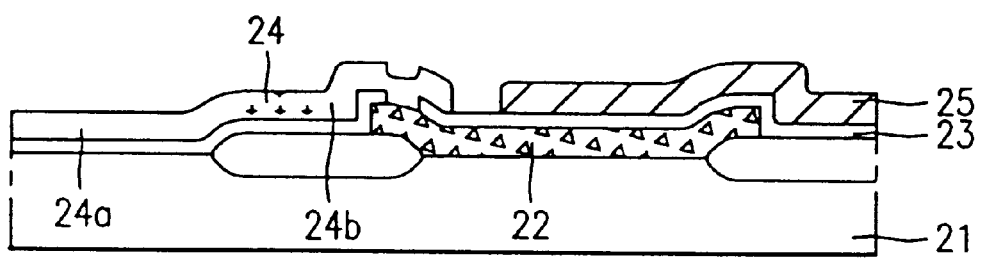
Figure 6C:
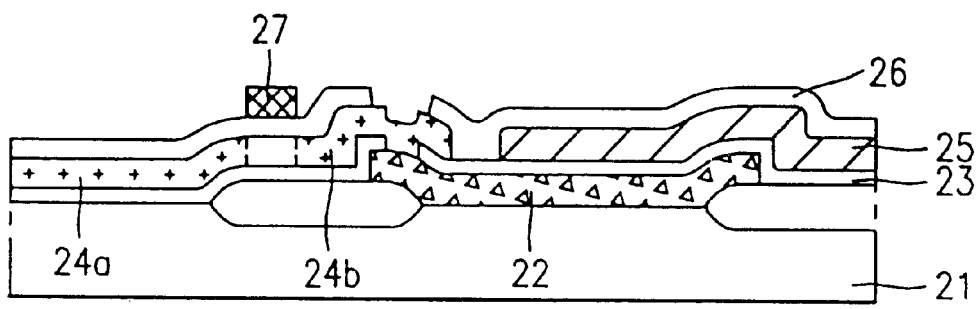

As shown in FIG. 6b, a second polysilicon film is deposited on first insulating film 23, thereby forming a semiconductor layer 24 in which an nMOS TFT and a Vss line 25 are provided. Next, as shown in FIG. 6c, a second insulating film 26 and a third polysilicon film are successively deposited on the entire surface of resultant structure including semiconductor layer 24 and Vss line 25. Photolithography and etching steps are then performed to pattern the polysilicon layer to form access transistor gate electrode 27 on a predetermined region of second insulating film 23 over the field oxide film.

Using access transistor gate electrode 27 as a mask, impurity ions are implanted into the semiconductor layer to form source/drain regions 24a and 24b.

Figure 6D:
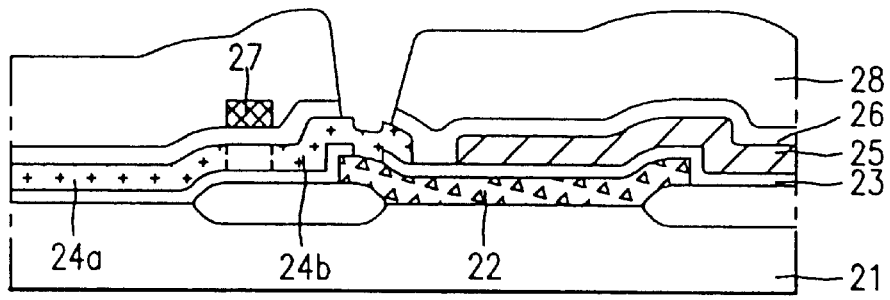

As shown in FIG. 6d, a third insulating film 28 is deposited on second insulating film 26 including access transistor gate electrode 27. Portions of third insulating film 28 and second insulating film 26 are then selectively removed so that a contact hole is formed exposing second impurity region 24b of the nMOS TFT.

Figure 6E:
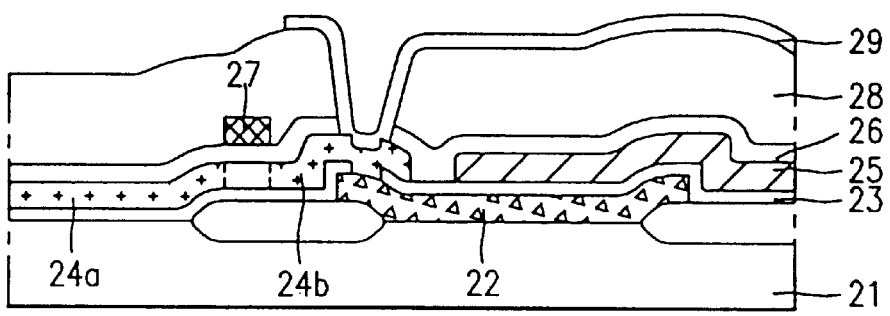

Next, as shown in FIG. 6e, a fourth polysilicon film is deposited on third insulating film 28 and formed with a contact hole. Using photolithography and etching techniques, the fourth polysilicon film is patterned to form a load resistor layer 29.

Figure 6F:
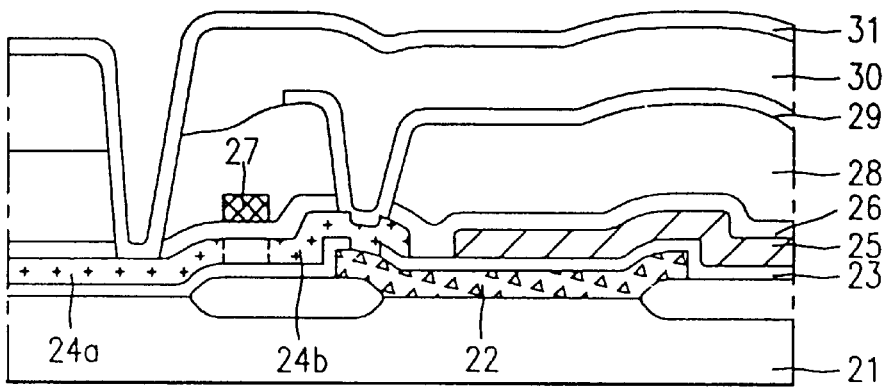

As shown in FIG. 6f a planarizing protection film 30, e.g., a boron phosphorous silicate glass (BPSG), is deposited on third insulating film 28 including load resistor layer 29.

Portions of protection film 30, third insulating film 28 and second insulating film 26 are then selectively removed so that a contact hole is formed to first impurity region 24a of the nMOS TFT for a data line contact.

A metal line 31 for use as a data line is deposited on the entire surface of protection film 30 and into the data line contact hole, thereby completing the semiconductor device.

Figure 7:
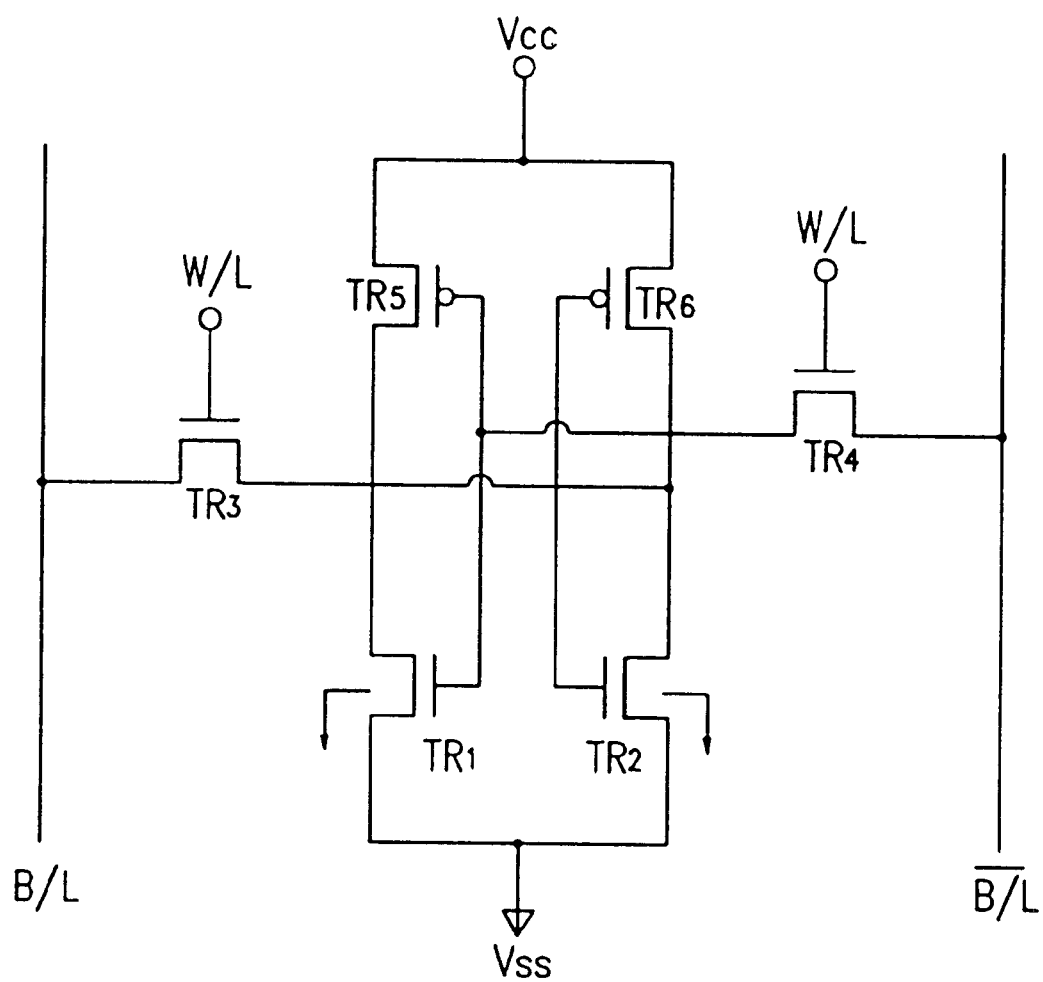
FIG. 7 is a schematic diagram of a semiconductor device according to a second embodiment of the present invention.
Figure 8:
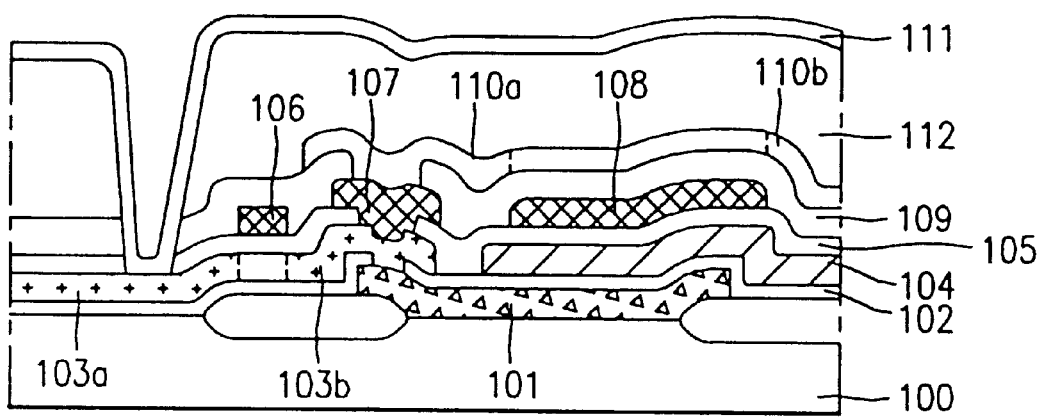
FIG. 8 is a cross-sectional view of a semiconductor device structure according to a second embodiment of the present invention.

FIG. 7 is a circuit diagram of a semiconductor device according to a second embodiment of the present invention, and FIG. 8 is a cross-sectional view showing a semiconductor device structure in accordance with a second embodiment of the present invention.

As shown in FIG. 7, the load device of the SRAM cell, according to the second embodiment, are PMOS transistors, instead of resistors as in the first embodiment. Otherwise, the circuit schematic of the second embodiment is similar to that of the first embodiment.

The semiconductor device structure, in accordance with the second embodiment seen in FIG. 8, includes a plurality of field oxide films formed on a semiconductor substrate 100 having a first conductivity type. Drive transistor gate electrode 101, having second conductivity type, is formed on first conductivity type semiconductor substrate 100 including a predetermined part of the field oxide film. First insulating film 102 is formed having a contact hole exposing part of drive transistor gate electrode 101. A semiconductor layer of a second conductivity type access transistor having separate first and second impurity regions 103a and 103b, respectively, is formed on first insulating film 102, and a Vss line 104 is formed spaced from the second impurity region 3b.

A second insulating film 105 is provided overlying the entire substrate surface except for contact holes over first impurity region 103a and second impurity region 103b. Second conductivity type access transistor gate electrode 106 is formed on second insulating film 105 over the isolating region of first impurity region 103a and second impurity region 103b. An electrode 107 of the first conductivity type is formed connected to second impurity region 103b which is also in contact with drive transistor gate electrode 101 of the second conductivity type drive transistor. A second gate electrode 108 of the first conductivity type is formed on second insulating film 105 over Vss line 104, and spaced from first gate electrode 107. A third insulating film 109 is formed on the entire surface except for a contact hole over first gate electrode 107 of the first conductivity type. A semiconductor layer of a transistor for use as a first conductivity type load element, which include first and second spaced impurity regions 110a and 110b of the first conductivity type is formed on third insulating film 109. Further, a portion of first impurity region 110a is electrically connected to region 103b. A metal line 111 is further formed so as to contact first impurity region 103a through the contact holes in insulating layers 105, 109, and protective film 112.

In the semiconductor device according to the second embodiment of the present invention, the access transistor is an nMOS TFT and the load element is a PMOS TFT.

The semiconductor layer of the first conductivity type transistor load element, i.e., the semiconductor layer in which the source/drain impurity regions 110a/110b of the PMOS TFT are formed, is provided over the gate electrode of the PMOS TFT, as shown in FIG. 8. Thus, it is possible to form the semiconductor layers below the gate electrode of the PMOS TFT.

As described above, in the structure of the semiconductor device according to the present invention, the access transistor includes an nMOS TFT. As a result, cell size is decreased, and low VCC characteristics are improved due to the reduction of junction capacitance.

While this invention has been described in connection with what is presently considered to be the most practical and preferred embodiments, it is to be understood that the invention is not limited to the disclosed embodiments, but, on the contrary, it is intended to cover various modifications and equivalent arrangements included within the spirit and scope of the appended claims.

What is claimed is:

1. A method for fabricating an SRAM, comprising the steps of:

forming a drive transistor on a substrate, the drive transistor including a gate electrode and a first gate insulating layer interposed between the gate electrode and the substrate;

forming first impurity regions in the substrate on opposite sides of the gate electrode of the drive transistor;

forming an insulating layer over the substrate, the insulating layer having a contact hole exposing a portion of the gate electrode of the drive transistor;

forming a semiconductor layer connected to the gate electrode of the drive transistor through the contact hole on the insulating layer;

forming a second gate insulating layer on the semiconductor layer;

forming an access transistor over the substrate, the access transistor including a gate electrode on the second gate insulating layer;

forming second impurity regions in the semiconductor layer on opposite sides of the gate electrode of the access transistor;

forming a load resistor connected to a first one of the second impurity regions; and forming a bit line connected to a second one of the second impurity regions.

2. A method for fabricating an SRAM, comprising the steps of:

forming a drive transistor on a substrate of a first conductivity type, the drive transistor including a first gate electrode and a first gate insulating layer interposed between the first gate electrode and the substrate;

forming first impurity regions in the substrate on opposite sides of the first gate electrode;

forming an insulating layer over the substrate, the insulating layer having a contact hole exposing a portion of the first gate electrode;

forming a first semiconductor layer connected to the first gate electrode through the contact hole on the insulating layer;

forming a second gate insulating layer on the first semiconductor layer;

forming an access transistor over the substrate, the access transistor including a second gate electrode on the second gate insulating layer;

forming second impurity regions in the first semiconductor layer on opposite sides of the second gate electrode;

forming a load transistor coupled to a first one of the second impurity regions; and forming a bit line connected to a second one of the second impurity regions.

3. The method for fabricating an SRAM as claimed in claim 2, wherein the step of forming a load transistor, includes the steps of:

forming a third gate electrode on the second gate insulating layer above the first gate electrode;

forming a third gate insulating layer on the substrate including the third gate electrode, the third gate insulating layer having a contact hole exposing part of the first one of the second impurity regions; and forming a second semiconductor layer having third and fourth impurity regions on opposite sides of the third gate electrode, the third impurity region connected to the first one of the second impurity regions.

* * * * *